United States Patent [19]

Ohba et al.

[11] Patent Number: 4,658,155
[45] Date of Patent: Apr. 14, 1987

[54] DRIVE CIRCUIT FOR A PIEZOELECTRIC ACTUATOR

[75] Inventors: Masatoshi Ohba, Nagaokakyo; Ryuichi Sato; Tsutomu Taniguchi, both of Kyoto, all of Japan

[73] Assignee: Omron Tateisi Electronics Co., Kyoto, Japan

[21] Appl. No.: 856,856

[22] Filed: Apr. 21, 1986

Related U.S. Application Data

[63] Continuation of Ser. No. 601,529, Apr. 18, 1984, abandoned.

[30] Foreign Application Priority Data

Apr. 19, 1983 [JP] Japan .................................. 58-59165

[51] Int. Cl.$^4$ ............................................. H01L 41/08
[52] U.S. Cl. ..................................... 307/154; 307/128; 310/316; 310/317; 200/181
[58] Field of Search ................... 307/113–128, 307/154; 200/181; 310/330, 331, 332, 326, 317, 318, 325, 327, 316; 331/154, 158, 160; 361/139, 140, 160, 161, 162, 163, 166, 206, 207, 152

[56] References Cited

U.S. PATENT DOCUMENTS

| | | | |
|---|---|---|---|
| 3,679,918 | 7/1972 | Keizi | 310/318 |
| 3,683,210 | 8/1972 | Kawada | 310/318 |
| 3,743,868 | 7/1973 | Kawada | 331/158 X |
| 3,989,042 | 11/1976 | Mitsui et al. | 310/316 X |
| 4,044,297 | 8/1977 | Nobue et al. | 310/317 X |
| 4,054,936 | 10/1977 | Ansai et al. | 310/318 X |
| 4,065,096 | 12/1977 | Frantz et al. | 361/152 X |
| 4,093,883 | 6/1978 | Yamamoto | 310/317 |
| 4,318,062 | 3/1982 | Mitsui et al. | 310/317 X |
| 4,376,255 | 3/1983 | Kleinschmidt | 310/317 |
| 4,395,651 | 7/1983 | Yamamoto | 310/317 |
| 4,409,638 | 10/1983 | Sturman et al. | 361/152 |
| 4,431,975 | 2/1984 | Podlesny | 310/317 X |
| 4,520,289 | 5/1985 | Sato et al. | 310/317 X |
| 4,568,849 | 2/1986 | Sato et al. | 310/317 X |

Primary Examiner—William M. Shoop, Jr.
Assistant Examiner—Shik Luen Paul Ip
Attorney, Agent, or Firm—Cushman, Darby & Cushman

[57] ABSTRACT

A drive circuit for a piezoelectric actuator includes a pair of power input terminals for supplying either AC or DC power, with the piezoelectric actuator being connected between these power input terminals. A device for supplying current for driving the piezoelectric actuator in one direction is interposed between one of the power input terminals and an end of the piezoelectric actuator. Further, there is provided connected in parallel to the piezoelectric actuator a switching circuit which turns into a high resistance state when the device is on and serves as an active discharge path for the electric charges of the piezoelectric actuator.

4 Claims, 2 Drawing Figures

DRIVE CIRCUIT FOR A PIEZOELECTRIC ACTUATOR

This is a continuation of application Ser. No. 601,529, filed Apr. 18, 1984, which was abandoned upon the filing hereof.

BACKGROUND OF THE INVENTION

The present invention relates to a drive circuit for a piezoelectric actuator.

In the field of relays, it is desirable to actuate the contacts with small power consumption. The piezoelectric actuator is attracting attention as a means for accomplishing this. On the other hand, in such an actuator, the restoring action when the input is turned off is required to be made as quickly as possible, and a drive circuit which can be supplied with either AC or DC power sources with a simple structure has been desired very strongly.

SUMMARY OF THE INVENTION

This invention was made in view of such circumstances, and its primary object is to provide a drive circuit for a piezoelectric actuator which is excellent in its restoring action, can be selectively used either with AC or DC power, and can safely prevent any misfunction in particular when AC power is used.

According to the most general aspect of the present invention, these and other objects are accomplished by a drive circuit for a piezoelectric actuator, comprising: a pair of power input terminals for both AC and DC power; a piezoelectric actuator connected between the power input terminals; a device for supplying current for driving the piezoelectric actuator in one direction interposed between one of the power input terminals and an end of the piezoelectric actuator; and a switching circuit which turns into a high resistance state when the device is on and serves as an active discharge path for the electric charges of the piezoelectric actuator, connected in parallel to the piezoelectric actuator.

According to such a structure, since the electric charges of the piezoelectric actuator are actively discharged through the switching circuit when the electric power input is off, the piezoelectric actuator is speeded up in its operation.

Furthermore, by a combination of the half wave rectifying device and a certain switching circuit, one of the power input terminals and the ground line of the switcing circuit are commonly connected so that either AC or DC power may be selectively used. Moreover, in the case of an AC input, since the high resistance state of the switching circuit is maintained even during the negative half cycle, although the piezoelectric actuator is driven by half wave rectified power, the humming of the piezoelectric actuator at such a time may be prevented. Furthermore, in the case of such AC input drive, the abovementioned restoring action is speeded up and the piezoelectric actuator may be adapted to short duration drive period applications.

In particular, near the zero crossing, through which the AC input turns from a positive half cycle to a negative half cycle, since the discharge preventing means prevents the switching circuit from turning into a low resistance state, inconveniences such as the generation of humming may be effectively prevented.

BRIEF DESCRIPTION OF THE DRAWINGS

The present invention will now be shown and described with reference to the preferred embodiment thereof, and with reference to the illustrative drawings. It should be clearly understood, however, that the description of the embodiment, and the drawings, are all of them given for the purposes of explanation only, and are not intended to be limitative of the scope of the present invention in any way. In the drawings, like parts and features are denoted by like reference symbols in the various figures thereof, and.

DESCRIPTION OF THE PREFERRED EMBODIMENT

Figure 1:
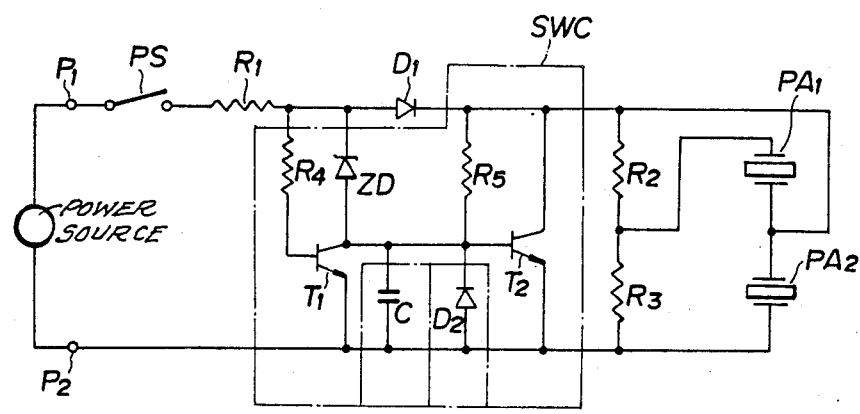
FIG. 1 is an electric circuit diagram showing an embodiment of the drive circuit for a piezoelectric actuator according to this invention.

The present invention will now be described with reference to the preferred embodiment thereof, and with reference to the appended drawings. FIG. 1 shows said preferred embodiment. In this figure, P1 and P2 are a pair of power input terminals, and are for instance connected to an AC power source AC. PS is a power switch, and R1 is a resistor. D1 is a rectifier for half wave rectification of the above mentioned power input, for instance consisting of a diode for rectification. R2 and R3 are a pair of resistors whose high voltage ends are connected to the cathode of the rectifying diode, and PA1 and PA2 are a pair of piezoelectric actuators.

SWC is a switching circuit which is connected to the high voltage ends of the piezoelectric actuators PA1 and PA2, consisting for instance of first and second switching transistors T1 and T2, bias resistors R4 and R5 for these transistors T1 and T2, and a Zener diode ZD.

C is a capacitor which functions as a discharge circuit for the switching circuit SWC, when the power input is off. D2 is a diode connected to the base of the second switching transistor T2, forming a discharge prohibiting means for maintaining the switching circuit SWC in the high resistance state near the zero crossing interval of the negative half cycle of the AC input.

Now, the action of the above described structure will be described. When the power switch PS is closed, the AC voltage of the AC power source AC is half wave rectified by the diode D1 for rectification. In other words, the rectified output corresponding to the positive half cycle of the AC power is suppied to the piezoelectric actuators PA1 and PA2, so that these piezoelectric actuators PA1 and PA2 undergo deformation in one direction under the piezoelectric effect (electrostriction).

Meanwhile, during the positive half cycle of the AC power, the base of the first switching transistor $T_1$ is driven and turns $T_1$ into the conducting state. As a result, the second switching transistor $T_2$ turns into the non-conducting state, and the switching circuit SWC turns into the high resistance state. During the negative half cycle, AC current flows through the diode D2 and the Zener diode ZD. As a result, the second switching transistor T2 is kept in the non-conducting state, and therefore the piezoelectric actuators PA1 and PA2 will not emit any humming sound when they are driven by half wave rectified power.

When the power switch PS is opened, the supply of electric power to the piezoelectric actuators PA1 and PA2 is stopped, and these piezoelectric actuators PA1 and PA2 begin a restoring deformation. At this moment, the electric charges of the piezoelectric actuators PA1 and PA2 flow into the capacitor C by way of a resistor R5. Since the electric charges of the piezoelectric actuators PA1 and PA2 are discharged through the second switching transistor T2 as a result, the restoring action is quickly made and this allows adaptation to the case where the on/off period becomes shorter. Further, when direct current power is connected to the input terminals P1 and P2, the same result can be obtained, thus allowing the use of both AC and DC power sources.

When the AC input crosses over from the positive half cycle to the negative half cycle, the electric charges of the piezoelectric actuators PA1 and PA2 start flowing through the capacitor C by way of the resistor R5 near the zero crossing, and the second switching transistor T2 is induced to become conductive, but since by the onset of a negative half cycle the second switching transistor T2 is inversely biased by the diode D2, the conduction of the second switching transistor T2 near the zero crossing interval can be effectively prohibited.

Figure 2:
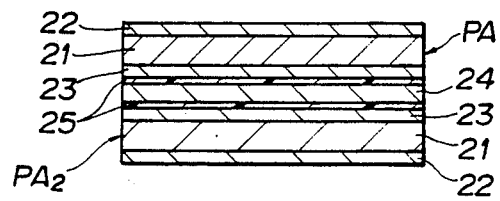
FIG. 2 is a sectional view showing an example of a piezoelectric actuator.

The piezoelectric actuators PA1 and PA2 may be integrated into one piece by adhering them together, as shown in FIG. 2. Specifically, the exemplary piezoelectric actuators PA1 and PA2 of this figure are each comprised of a piezoelectric material 21 and electrode layers 22 and 23 coated to both the surfaces. These electrode layers 22 and 23 are chromium spatter or vapor deposition layers. And one of the electrode layers 23 of each of the piezoelectric actuators PA1 and PA2 are adhered together by epoxy material 25 into one piece, and the electrode layer 23 of the piezoelectric actuator PA1 and the electrode layer 23 of the piezoelectric actuator PA2 are connected together externally.

For example, in actual size, the right hand end in the sense of the drawings is supported on a fixed member, and an armature of a relay is fixedly secured to the left end.

Although the present invention has been shown and described with reference to the preferred embodiment thereof, and in terms of the illustrative drawings, it should not be considered as limited thereby. Various possible modifications, omissions, and alterations could be conceived of by one skilled in the art to the form and the content of any particular embodiment, without departing from the scope of the present invention. Therefore it is desired that the scope of the present invention should be defined solely by the scope of the appended claims.

What is claimed is:

1. A drive circuit used for driving a piezoelectric actuator, comprising:
    a pair of power input terminals for receiving any one of AC or DC power;
    a piezoelectric actuator connected between the power input terminals;
    means for supplying current for driving the piezoelectric actuator in one direction interposed between one of the power input terminals and an end of the piezoelectric actuator;
    switching means having a high resistance state when switched on and serving as an active discharge path for the electric charges of the piezoelectric actuator when said drive circuit is switched off, and switching means being connected in parallel to the piezoelectric actuator and;
    discharge prohibiting means for maintaining said switching means in the high resistance state when said pair of input terminals receives any one of AC or DC power.

2. A drive circuit for a piezoelectric actuator according to claim 1, wherein said current supplying means comprises a half wave rectifying circuit.

3. A drive circuit for a piezoelectric actuator according to claim 1, wherein AC power is supplied and said switching means assumes a high resistance state with respect to the piezoelectric actuator during the period of one of the half cycles of the AC input including the period near zero crossing.

4. A drive circuit for a piezoelectric actuator according to claim 1, wherein
    said switching means comprises: a capacitor which is shortcircuited during the period in which the piezoelectric actuator is charged and driven, and is charged by the voltage across the piezoelectric actuator when the charging and the driving of the piezoelectric actuator have ceased; and a switching device which turns into a high resistance state with respect to the piezoelectric actuator by being turned off during the period in which the piezoelectric actuator is charged and driven and rapidly discharges the charged electric charges of the piezoelectric actuator by being turned on by the voltage across the capacitor when the charging and driving of the piezoelectric actuator has ceased; and
    said discharge prohibiting means comprises a diode which turns off the switching device during one of the half cycles of the AC input.

* * * * *